United States Patent [19]

Shimizu et al.

[11] Patent Number: 4,930,132
[45] Date of Patent: May 29, 1990

[54] SECOND HARMONIC WAVE GENERATING DEVICE HAVING ACTIVE LAYER AND SECOND HARMONIC WAVE GENERATING LAYER ON SAME SUBSTRATE

[75] Inventors: Akira Shimizu, Inagi; Sotomitsu Ikeda, Atsugi, both of Japan

[73] Assignee: Canon Kabushiki Kaisha, Tokyo, Japan

[21] Appl. No.: 288,457

[22] Filed: Dec. 22, 1988

[30] Foreign Application Priority Data

Dec. 28, 1987 [JP] Japan ................... 62-334972
Jun. 14, 1988 [JP] Japan ................... 63-144867

[51] Int. Cl.$^5$ ................................ H01S 3/10
[52] U.S. Cl. ........................ 372/22; 372/45; 307/427
[58] Field of Search ............. 372/23, 22, 43, 44; 307/425–428

[56] References Cited

U.S. PATENT DOCUMENTS

| | | | |
|---|---|---|---|
| 4,743,083 | 5/1988 | Schimpe | 350/96.19 |
| 4,794,608 | 12/1988 | Fujita et al. | 372/92 |
| 4,794,609 | 12/1988 | Hara et al. | 372/50 |
| 4,794,611 | 12/1988 | Hara et al. | 372/45 |
| 4,796,067 | 1/1989 | Shimizu et al. | 357/4 |
| 4,799,299 | 1/1989 | Miyazawa et al. | 372/45 |
| 4,829,534 | 5/1989 | Miyazawa et al. | 372/46 |

Primary Examiner—Leon Scott, Jr.
Attorney, Agent, or Firm—Fitzpatrick, Cella, Harper & Scinto

[57] ABSTRACT

A second harmonic wave generating device comprises: a substrate; an active layer formed on said substrate and adapted for generating light of a wavelength $\lambda$ in response to the injection of a current; a layer of a second harmonic wave generating material formed on the substrate and adapted for generating light of a wavelength $\lambda/2$ from the light generated in the active layer; and a pair of electrodes for supplying the active layer with a current.

21 Claims, 7 Drawing Sheets

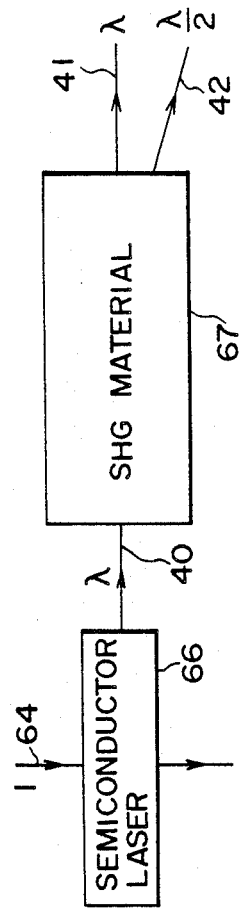
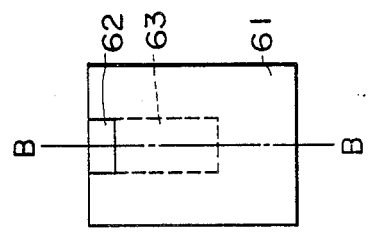
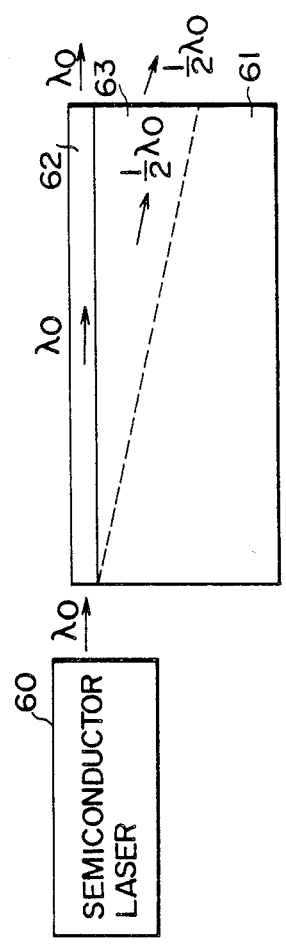
FIG. 1 PRIOR ART
FIG. 2A PRIOR ART
FIG. 2B PRIOR ART

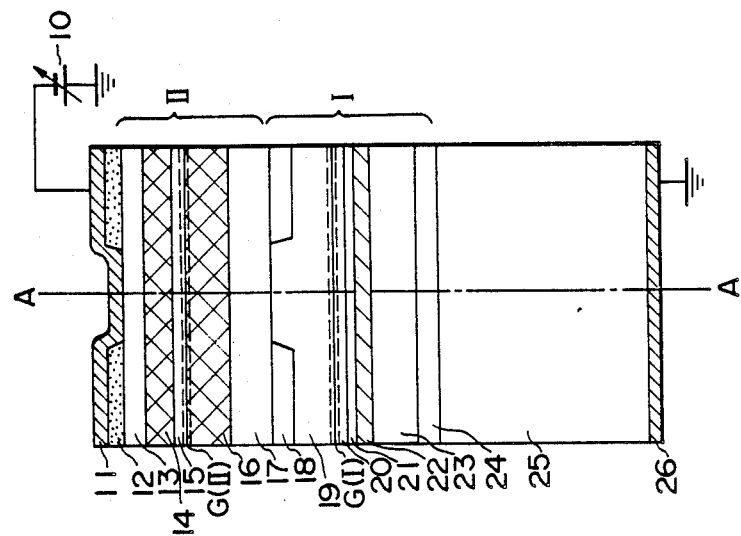
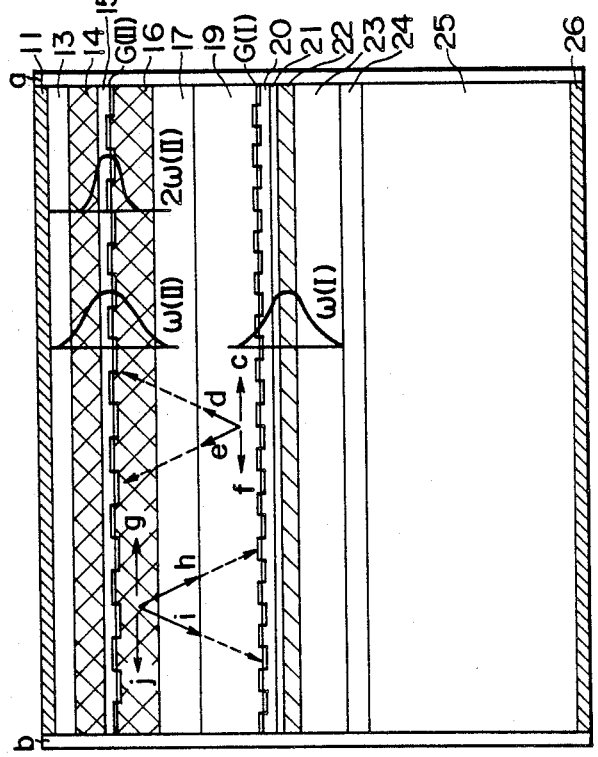
FIG.7B
FIG.7A

[SECOND HARMONIC WAVE GENERATING DEVICE HAVING ACTIVE LAYER AND SECOND HARMONIC WAVE GENERATING LAYER ON SAME SUBSTRATE]

SECOND HARMONIC WAVE GENERATING DEVICE HAVING ACTIVE LAYER AND SECOND HARMONIC WAVE GENERATING LAYER ON SAME SUBSTRATE

BACKGROUND OF THE INVENTION

1. Field of the Invention

The present invention relates to a second harmonic wave generating device useful as a light source for example for optical information recording and regeneration, or for semiconductor manufacturing processes.

2. Related Background Art

Semiconductor lasers have been generally employed for such light sources. However it is difficult to utilize the semiconductor laser as a light source of a short wavelength, because it can only emit photons of an energy close to the band gap energy Eg determined by the material constituting the active layer. For this reason there has been proposed a device for obtaining light of a short wavelength, utilizing second harmonic wave generation, as schematically illustrated in FIG. 1.

In FIG. 1, a semiconductor laser 66 emits light 40 of a wavelength $\lambda$ when a current 64 is injected. Said light 40 enters a second harmonic generating (SHG) material 67 with a large second nonlinear constant $\chi$, which generates a second harmonic wave 42 of a wavelength $\lambda/2$ together with a transmitted wave 41 of the wavelength $\lambda$.

FIGS. 2A and 2B illustrate details of a conventional second harmonic generating device, wherein FIG. 2B is an elevation view seen from the proceeding direction of the light, while FIG. 2A is a schematic cross-sectional view along a line B—B in FIG. 2B. Said device comprises a basic wave generating light source 60 and a converter element 61 for converting the wavelength of the basic laser beam.

When the basic wave (angular frequency $\omega$; wavelength $\lambda_0$) is introduced from the light source 60 to a wave guide channel 62 of the converter element 61, a part of said basic wave propagates in a diagonally downward area 63 with respect to said wave guide channel 62 and is converted into a second harmonic wave (angular frequency $2\omega$; wavelength $\lambda_0/2$). The propagating area 63 for the second harmonic wave is diagonally downwards because the second harmonic wave matches in phase with the basic wave in this direction.

A converter element 61 composed of a LiNbO$_3$ crystal in which the wave guide channel 62 is formed by replacing Li$^+$ in said crystal with H$^+$ by ion exchange is described in "SHG element utilizing ridge-type LiNO$_3$ wave guide channel" Preprints for 48th Symposium of Academy of Applied Physics, 19P/ZG/3, Fall 1987. According to this publication, this converter element emits a second harmonic wave of a wavelength of 0.42 $\mu$m upon receiving a semiconductor laser beam of a wavelength of 0.84 $\mu$m as the basic wave.

Such second harmonic wave generating device, if utilized in the recording or regeneration of an optical recording medium such as an optical disk, can reduce the area of the light spot by $\frac{1}{4}$ by reducing the wavelength of the laser beam by $\frac{1}{2}$, thereby quadrupling the optical recording density. It can also be utilized in semiconductor manufacturing processes utilizing light, such as exposure, etching or doping, for increasing the pattern density.

However the above-explained device has been associated with the following drawbacks that:

(1) it is difficult to efficiently introduce the basic wave into the converter element, due to the reflection at the entrance end face thereof;

(2) the entire device is bulky since the converter element is inevitably several centimeters long, though the semiconductor laser itself for generating the basic wave is less than 1 mm in size; and (3) the conversion efficiency is low, for example about 2.5% in the above-mentioned LiNbO$_3$ crystal as only a small portion of the basic wave is converted into the second harmonic wave.

SUMMARY OF THE INVENTION

The object of the present invention is to provide a device not associated with the above-mentioned drawbacks of the prior art and capable of efficiently generating the second harmonic wave in a compact structure.

The above-mentioned object can be achieved, according to the present invention, by a second harmonic wave generating device comprising:

a substrate;

an active layer formed on said substrate and adapted for generating light of a wavelength $\lambda$ in response to the injection of a current;

a second harmonic wave generating layer formed on said substrate and adapted to generate light of a wavelength of $\lambda/2$ from the light generated in said active layer; and a pair of electrodes for supplying said active layer with a current.

The device of the present invention is further provided with a pair of end faces constituting a laser oscillator, said end faces being preferably provided with a coating for confining the light of wavelength $\lambda$ within said oscillator and transmitting the light of wavelength $\lambda/2$ to the outside. Said coating can be so constructed as to have a reflectance R($\lambda$) of about 100% for the light of wavelength $\lambda$ on both end faces and a reflectance R($\lambda/2$) of about 0% for the light of wavelength $\lambda/2$ on at least an end face.

According to the present invention, the above-mentioned drawback (1) is eliminated since the SHG material is incorporated in the element itself. Also the drawback (2) is eliminated since the light of wavelength $\lambda$ reciprocates plural times within the oscillator to obtain a practically long distance. Also since the light of wavelength $\lambda$ is almost confined within the element, the losses are limited to non-emitting recombination, spontaneous light emission and absorption. Thus the efficiency of emission of the light of short wavelength is significantly improved in comparison with that in the prior technology, so that the above-mentioned drawback (3) is also eliminated.

BRIEF DESCRIPTION OF THE DRAWINGS

FIGS. 1, 2A and 2B are schematic views showing conventional second harmonic wave generating devices;

FIGS. 7A and 7B are respectively a lateral view and a frontal cross-sectional view of an embodiment of the present invention, having a diffraction grating within the element;

DESCRIPTION OF THE PREFERRED EMBODIMENTS

Now the present invention will be clarified in detail by embodiments thereof shown in the attached drawings.

Figure 3:
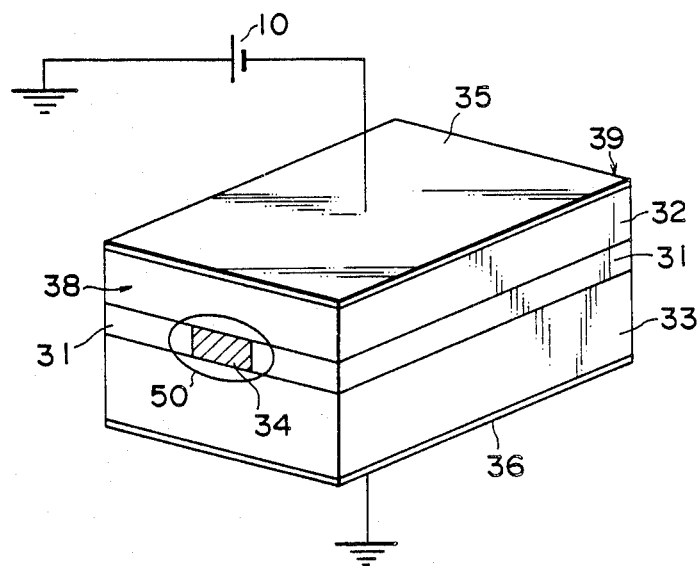
FIG. 3 is a schematic perspective view of an embodiment of the present invention.

FIG. 3 is a schematic perspective view of a semiconductor laser element embodying the present invention, wherein shown are a power source 10; an active layer 34 composed for example of GaAs; clad layers 32, 33 composed for example of AlGaAs; electrodes 35, 36; end faces 38, 39 constituting an oscillator; a SHG material 31; and a light intensity distribution 50 in the oscillation mode. The clad layer 33 also serves as a substrate.

When a voltage is applied across the electrodes 35, 36, electrons and positive holes are respectively injected from the clad layers 32, 33 into the active layer 34, whereby a laser oscillation takes place in the oscillator defined by the end faces 38, 39 to emit the light of a wavelength $\lambda$. The above-explained function is same as in the ordinary semiconductor laser. In the present embodiment, there are provided SHG materials 31 (for example $LiNbO_3$, KDP, MNA or a multiple quantum potential well structure with an applied electric field) in the areas on both sides of the active layer 34, where the light intensity distribution 50 in the oscillation mode is not zero.

On each of the end faces 38, 39 there is provided a multi-layered coating, which is so constructed as to have a reflectance $R(\lambda)$ of 99% for the light of wavelength $\lambda$ and a reflectance $R(\lambda/2)$ of 1% for the light of wavelength $\lambda/2$.

Figure 4:
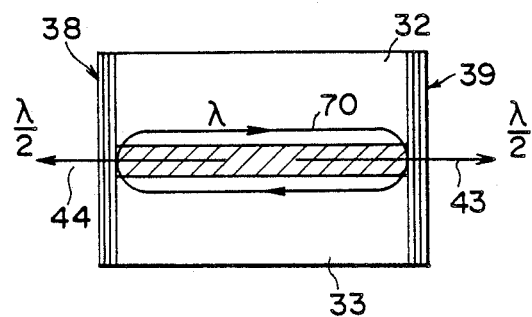
FIG. 4 is a schematic view showing the behavior of light in the embodiment shown in FIG. 3.

FIG. 4 is a conceptual drawing showing the behavior of light in the embodiment shown in FIG. 3, wherein same components as those in FIG. 3 are represented by same numbers and will not be explained again.

In the above-explained structure, the generated light 70 of wavelength $\lambda$ scarcely leaks to the outside but reciprocates plural times in the oscillator.

Since the light intensity distribution 50 extends to the SHG materials 31, the light of wavelength $\lambda$ is converted, little by little, into the light of wavelength $\lambda/2$. As the end faces 38, 39 have a low reflectance to the light of wavelength $\lambda/2$, said light is taken out to the outside, as indicated by 44 and 43 before it is absorbed within the element. Since the light of wavelength $\lambda$ is scarcely emitted to the outside, the oscillation is easier in comparison with the case of conventional semiconductor laser with $R(\lambda)$ = ca. 30%, and the threshold current $I_{th}$ becomes smaller.

Preferred dimensions in the above-explained embodiment are: thickness of the active layer 34 in a range of 30 Å to 1 μm, width thereof in a range of 0.5 to 100 μm, thickness of the SHG material 31 in a range of 30 Å to 10 μm, and length of the oscillator (distance between the end faces 38, 39) in a range of 1 μm to 1 mm. Furthermore, the length of the oscillator should not preferably exceed 50 μm in order to reduce the absorption for the light of wavelength of $\lambda/2$ and to improve the efficiency.

In the embodiment shown in FIG. 3, the SHG materials 31, being of a low refractive index and composed of an insulating material, contribute to the formation of wave guide channel and to the constriction of electric current. In this manner, three functions (conversion of wavelength from $\lambda$ to $\lambda/2$, formation of wave guide channel, and constriction of current) are achieved with a single SHG material. So, this construction is in simple and has the above-listed high functions. Also this embodiment has the advantage of preventing the multiplication of the longitudinal mode, since the incorporation of the SHG material allows reduction in the length of the oscillator.

The SHG material is preferably transparent to the light of wavelength $\lambda/2$ in consideration of the efficiency. However, even if it is not transparent, the efficiency is not too much deteriorated by reducing the length of the oscillator, since the light is emitted from the element before it is subjected to significant absorption.

Figure 5:
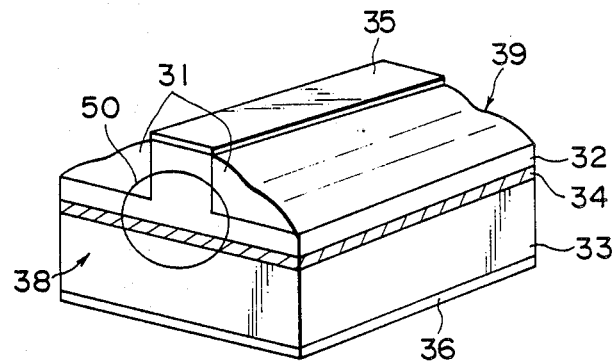
FIGS. 5 and 6 are schematic perspective views respectively showing other embodiments of the present invention.
Figure 6:
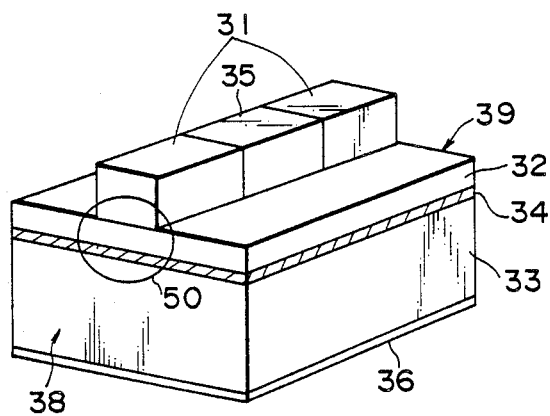

FIGS. 5 and 6 are schematic perspective views showing other embodiments of the semiconductor laser element of the present invention. In these drawings, the same components as those in FIG. 3 are represented by the same numbers and will not be explained further.

FIG. 5 shows a semiconductor laser element of so-called ridge wave guide channel type, wherein a wave guide channel is obtained by forming a stripeshaped projection on the clad layer 32. The SHG materials 31 are provided on both sides of the ridge portion where an insulating portion, composed for example of $Si_3N_4$, is formed. This embodiment is advantageous in that it is easier to manufacture than the embodiment shown in FIG. 3.

In the embodiment shown in FIG. 6, the SHG materials 31 are not provided in continuous manner between the end faces 38, 39 but in limited portions therebetween.

In case the SHG material has an elevated absorption, this structure generates the light of wavelength $\lambda/2$ only in the vicinity of the end faces, thereby achieving an effect of reducing the absorption.

FIGS. 7A and 7B illustrate another embodiment of the device of the present invention, wherein FIG. 7B is a cross-sectional view in a direction parallel to the oscillating plane, and FIG. 7A is a cross-sectional view along a line A—A in FIG. 7B.

In the element of the present embodiment, a GaAs-/AlGaAs series semiconductor laser (I) is formed on a $p^+$ - GaAs substrate 25, and a ZeSeS series SHG area (II) is formed thereon by eptaxial growth by use of MBE method.

A diffraction grating G(I) is formed inside said semiconductor laser (I), while another diffraction grating G(II) is formed inside the SHG area (II). Also in order to apply a forward voltage (in a direction perpendicular to the laminated films) to this element there is formed a p-type electrode 26 composed of AV is formed under the substrate 25, and an n-type electrode 11 composed of AV is formed on the SHG area (II) through an insulating layer 12 composed for example of $Si_3N_4$ or $SiO_2$ and constituting a current injection window.

Said semiconductor laser (I) is preferably formed by crystal of a III-V group compound semiconductor, and semiconductors of GaInAs, GaAsSb and GaInAsP serieses in addition to AlGaAs series semiconductors can be used for this purpose.

Also said SHG area is formed by crystal of II-VI group compound semiconductor, and crystals of ZnSeTe and CdHgTe serieses can be used for this purpose in addition to those of ZeSeS series. These materials can be grown by epitaxy for example on an AlGaAs series semiconductor laser, so that the SHG area can be easily integrated with the semiconductor laser.

In the device of the present embodiment, the introduction of the basic wave generated from the semiconductor laser into the SHG area and the optical combination of these two areas are achieved by a diffraction grating G(I) in a position for receiving the laser beam, constituting the basic wave, from the active layer of said semiconductor laser, and a diffraction grating G(II) in a position for receiving the laser beam diffracted by the firstmentioned grating in the semiconductor laser.

More specifically, the basic wave generated from the semiconductor laser is diffracted, by the diffraction grating G(I) in the semiconductor laser, toward the SHG area, and the basic wave thus introduced is diffracted again by the diffraction grating G(II) in the SHG area for achieving effective conversion into the second harmonic wave.

The diffraction grating used herein means, for example, an interface, having regular undulations, between two layers of different refractive indexes.

In the following there will be given a more detailed explanation of the structure of the semiconductor laser (I) and the SHG area (II) of the present embodiment.

The GaAs/AlGaAs series semiconductor laser (I) has a double hetero structure composed of a p-GaAs active layer of a thickness of 0.1 μm sandwiched between a p-$Al_{0.4}Ga_{0.6}As$ p-clad layer 23 and an n-$Al_{0.2}Ga_{0.8}As$ n-clad layers 19, 21, with the diffraction grating G(I) formed between an n-$Al_{0.4}Ga_{0.6}As$ layer 20 and the n-clad layer 19. Also for the purpose of constricting the path of the current, an i-$Al_{0.2}Ga_{0.8}As$ layer 18 is embedded by re-growth after formation and ethcing of the n-clad layer 19. Also a $p^+$-GaAs buffer layer 24 is formed between the substrate 25 and the p-clad layer 23.

In the following explained is the pitch of the diffraction grating G(I).

In the present embodiment, the semiconductor laser (I) and the SHG area (II) are so joined that the wave guide channels are mutually parallel, and the diffraction gratings G(I) and G(II) are also parallel thereto, so that the pitch $\Lambda_1$ of the grating G(I) can be determined by the following equation (1):

$$\Lambda_1 = l \cdot (\lambda_0 / 2\bar{n}) \tag{1}$$

wherein $\lambda_0$ : wavelength of the basic wave laser beam in vacuum $\bar{n}$ : effective refractive index of the basic wave laser beam in the area of diffraction grating l : number of order; namely an integer equal to or larger than 1.

There is required a condition $l \geq 2$, and a pitch for $l=3$ is adopted in the present embodiment. A condition $l=3$ seems most appropriate, since a larger value of l facilitates the formation of diffraction gratings while a smaller value of l improves the coupling efficiency.

In the present embodiment, the pitch $\Lambda_1$ is defined as 399 nm according to the equation (1), since the basic wave emitted from the active layer 22 has parameters $\lambda_0 = 900$ nm and $\bar{n} = 3.385$.

The ZnSeS series SHG area (II) has an n-$ZnSe_{0.9}S_{0.1}$ layer 15 between SHG layers 14, 16 of Ga-doped n-ZnSe, and the diffraction grating G(II) is formed at the interface between the layers 15 and 16. The diffraction grating G(II) is formed by adding n-$ZnSe_{0.9}S_{0.1}$ in the central area of the Ga-doped n-ZnSe layer.

In this manner the SHG layers 14, 16 are sandwiched between the $n^+$-$ZnSe_{0.9}S_{0.1}$ layers 13, 17 in order that the SHG layers 14, 16 constitute wave guide channels, or that the light is confined within said layers 14, 16. Also the SHG layers 13, 17 have a higher carrier concentration, in order to improve the ohmic contact.

The pitch of the diffraction grating G(II) is determined, in order that the light diffracted from the grating G(I) in the semiconductor laser can enter and couple with the grating G(II), according to the aforementioned equation (1) and with a same number of order (l) as in the grating G(I). In the present embodiment there is selected a condition $l=3$.

The pitch $\Lambda_2$ is calculated as 543 nm from the equation (1) and from the conditions $l=3$, $\lambda_0 = 900$ nm and $\bar{n} = 2.485$.

The rear end face b of the element of the present embodiment is coated with multiple dielectric films composed for example of $TiO_2$ or $SiO_2$, thus having a reflectance to the basic wave and the second harmonic wave. On the other hand, the front end face is coated with a modified composition of the dielectric multiple films to have a reflectance of 90% or higher to the basic wave, but of about 10% to the second harmonic wave.

In the following there will be explained a process of generating the second harmonic wave in the device of the present embodiment.

At first a current is injected in the forward direction of the device as shown in FIG. 7B. Thus the carriers are injected from the n-type electrode 11 and the p-type electrode 26. The carriers from said n-type electrode 11 are injected, through the current injection window where the insulating layer 12 is not present, to the SHG area (II), and further injected into the semiconductor laser (I) because the SHG area (II) in n-type.

Thus the laser beam constituting the basic wave (wavelength $\lambda_0 = 900$ nm; effective refractive index in the laser $\bar{n} = 3.385$) is generated with a light intensity distribution of the mode $\omega(I)$ shown in FIG. 7A.

As shown by the mode $\omega(I)$, the generated basic wave is sufficiently present in the grating G(I), and the basic wave in said grating is diffracted in directions c, d, e and f. The diffraction angle (angle between the diffracted light and the normal line to the plane of grating) can be calculated from the following equation (2):

$$\sin \theta = (2m/l) - 1 \tag{2}$$

wherein $\theta$ : diffraction angle m : 0, 1, 2 or 3 l : number of order in the equation (1)

Since $l=3$ in the present embodiment, the equation (2) can be rewritten as (3):

$$\sin \theta = (2m/3) - 1 \tag{3}$$

wherein $\theta$ : diffraction angle m : 0, 1, 2 or 3

Consequently, according to the equation (3), the diffraction angle becomes equal to 0°, 70.5°, 109.5° and 180°.

Among these four diffracted lights, those of the angles 70.5° and 109.5° (directions e and f) enters the SHG area (II) and is coupled with the grating G(II).

The diffracted lights of the basic wave which have entered the grating G(II) are diffracted into directions g, h, i and j. As the grating G(II) has a number of order same as that of the grating G(I) (l=3), the diffraction angles become equal to 0°, 70.5°, 109.5° and 180° from the equation (3).

Among these four diffracted lights, those with the angles 0° and 180° (directions j and g) remain in the SHG layers 14, 16, thus generating the laser light of the basic wave of the light intensity distribution of the mode $\omega$(II) shown in FIG. 7A. A part of said basic wave of the mode $\omega$(II) is converted, by the second-order non-linear effect in the SHG layers 14 and 16, into the second harmonic wave of the light intensity distribution of the mode 2$\omega$(II) shown in FIG. 7A.

Said second harmonic wave is phase matched during propagation in the SHG area, and emerges from the front end face a. The basic waves of the modes $\omega$(I) and $\omega$(II) scarcely emerge, since the reflectance of the front end face is as low as about 10% to the second harmonic wave but equal to or higher than 90% to the basic wave as explained before.

In this manner the semiconductor laser (I) and the SHG area (II) are optically coupled through the diffraction gratings G(I) and G(II).

Also in the semiconductor laser (I), a part of the basic laser light is converted into the second harmonic wave due to the non-linearity of AlGaAs, but such converted light is mostly absorbed within the semiconductor laser (I). The unabsorbed portion enters the SHG area (II) together with the basic wave and emerges from the front end face a, since the gratings (I) and (II) function as those of 6th order (l=6).

Figure 8:
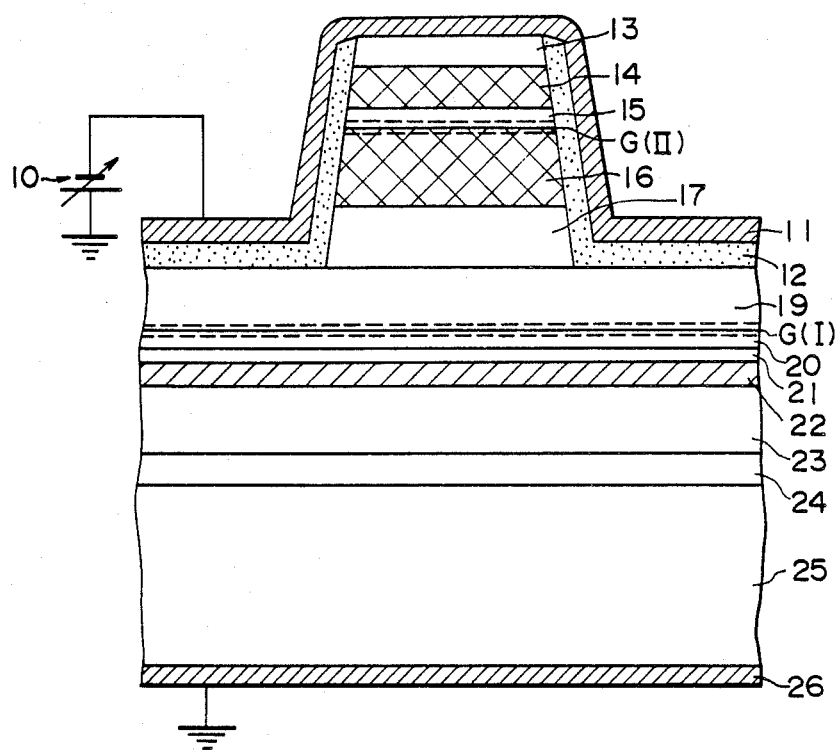
FIGS. 8 to 10 are frontal cross-sectional views showing variations of the element shown in FIG. 7B.

FIG. 8 is a cross-sectional view in a direction parallel to the oscillating plane, showing a variation of the element shown in FIG. 7.

The device of the present embodiment is similar to those of the preceding embodiments except that the SHG area (II) is ridge-formed.

The ridge-formed SHG area (II) improves the confinement of the second harmonic wave in the lateral direction, and dispenses therefore with the i-Al$_{0.2}$Ga$_{0.8}$As layer 18 for current constriction, shown in FIG. 7B.

In the semiconductor laser (I) of the present embodiment, since the refractive index is made larger in the lower part of the ridge, the generated light is confined in said lower part by the difference in the refractive index. In this manner the semiconductor laser (I) of the present embodiment has a high efficiency due to the refractive index wave guide type.

Figure 9:
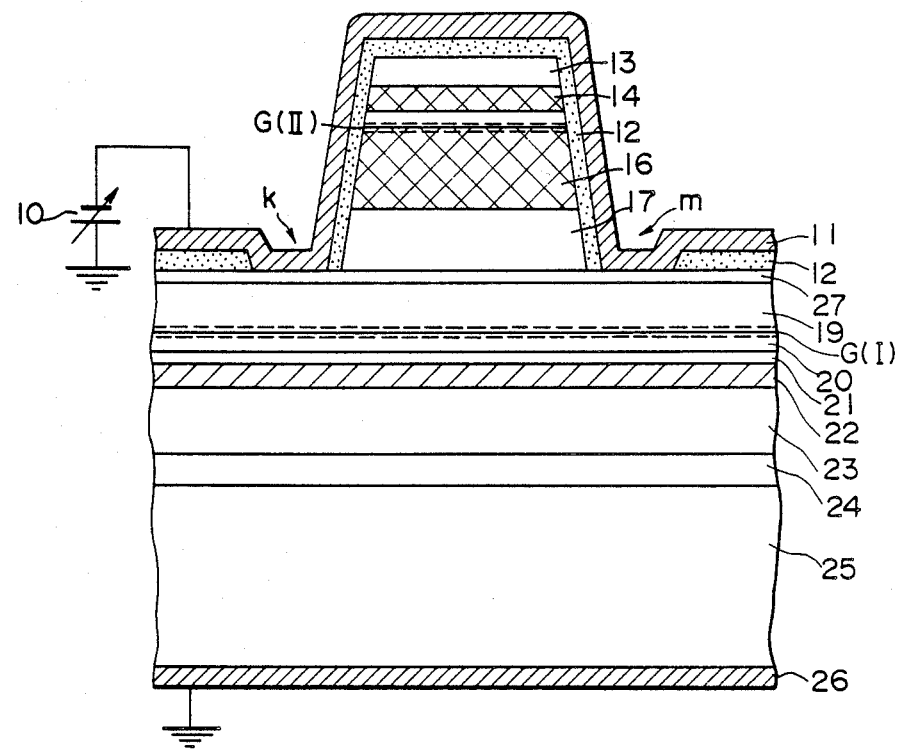

FIG. 9 is a cross-sectional view in a direction parallel to the oscillating plane, showing another variation of the device shown in FIG. 8.

The device of this embodiment is similar to that shown in FIG. 8, except that the current injection window, formed by the insulating layer 12, is formed not on the upper face of the ridge but on both sides k, m in the lower part of the ridge.

There is newly added a n$^+$-GaAs cap layer 27 of a low resistance, in order to improve ohmic contact.

In the present embodiment, current does not flow in the SHG area (II) composed of crystal of a II-VI group compound semiconductor. It is therefore possible to prevent a high potential of several tens of volts in the SHG area (II) which are encountered in case a current is directly supplied to the SHG area (II) at the laser driving.

Also in the present embodiment, due to the absence of current in the SHG area (II), it is not necessary to carry out the impurity doping for the II-VI group semiconductor constituting the SHG area (II), the laser driving voltage can be reduced, and it is possible to avoid the absorption of the harmonic waves resulting from the reduction in the energy gap of the SHG area (II). Also, in case a current is directly given to the SHG area (II), the substrate 26 has to be p-type because the SHG area (II) is n-type. However, in the present embodiment the substrate may be of p-type or n-type.

Furthermore, the present embodiment is superior in the stability in the lateral mode of the basic laser light generated from the semiconductor laser (I) because the current is injected from both sides k, m in the lower part of the ridge. The reason for this advantage will be explained in the following.

An ordinary semiconductor laser is associated with a plasma effect that the refractive index of the portion where the carrier concentration increased becomes lower in proportion to the increase in the carrier concentration. Consequently, if the current is injected from the top of the ridge, the refractive index becomes lower in an area close to the peak of the carrier distribution (gain-distribution), and the laser light leaks laterally corresponding to said decrease in refractive index. However, in the present embodiment, since the current is injected from both sides k, m in the lower part of the ridge, the carriers in the active layer 22 assume a broad Gaussian like distribution or a double-peaked like distribution. In addition, below the areas k, m, the equivalent refractive index becomes lower due to the plasma effect. In the device of the present embodiment, the carriers are confined in the lower part of the ridge because the equivalent refractive index in said lower part is selected lower as in the second embodiment, and the lowering of said refractive index in said lower part enhances the difference in the refractive index, thereby improving the confinement.

Figure 10:
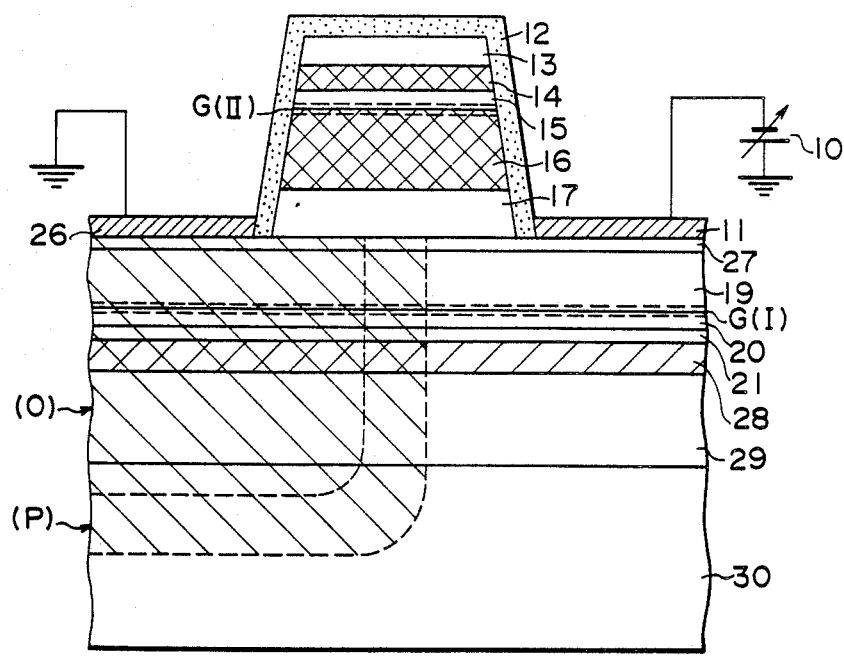

FIG. 10 is a cross-sectional view in a direction parallel to the oscillating plane, showing still another variation of the device shown in FIG. 9.

Said device is similar to that shown in FIG. 9, except that the semiconductor laser (I) is of a transverse junction stripe one (TJS).

In the following the structure of said semiconductor laser (I) will be explained in detail.

In said semiconductor laser (I), an n-type AlGaAs semiconductor crystal is epitaxially grown on an insulating i-GaAs substrate 30, so that the active layer 28 has a double heterogeneous structure. After the formation of n-AlGaAs film, a low Zn-concentration diffusion area (p) and a high Zn-concentration diffusion area (o) are formed by Zn diffusion, and a homogeneous p-p$^+$-n junction is formed in lateral direction in the n-GaAs active layer 28 to constitute a recombination zone. The carriers are injected into the semiconductor laser (I) through the p-electrode 26 and the n-electrode 11.

In this manner, the present embodiment has the advantages caused by the TJS structure, that is, it is capable of satisfactorily generating the second harmonic wave and suitable for integration due to the use of an insulating substrate.

In the foregoing embodiments, the SHG area has a ZnSe double heterogeneous structure, but it may also have a superlattice structure, for example a multiple periodical structure such as ZnSe 50 Å/ZnSe$_{0.9}$S$_{0.1}$50 Å.

Figure 11:
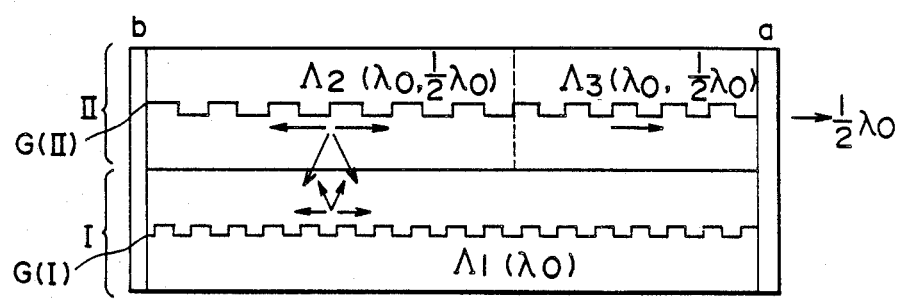
FIG. 11 is a schematic view of the diffraction grating employed in the embodiments shown in FIGS. 7A to 10.

Also instead of the diffraction grating (II) of a constant pitch in the foregoing embodiments, there may be employed a grating with a partially modified pitch as shown in FIG. 11 for phase matching of the second harmonic wave, thereby causing emission of the harmonic wave perpendicularly from the end face.

In the following there wil be explained the modification of the pitch of the grating for phase matching of the second harmonic wave.

In the foregoing embodiments, the pitch $\Lambda_1$ of the grating in the semiconductor laser and that $\Lambda_2$ of the grating in the SHG area are determined from the equation (1), according to the wavelength $\lambda_0$ of the basic wave and the effective refractive index $\bar{n}$.

Thus, the phase matching of the second harmonic wave cannot be achieved by the equation (1), because the second harmonic wave generated in the SHG area (II), having a wavelength $\lambda_0/2$, has an effective refractive index different from that for the basic wave.

The grating pitch $\Lambda_3$ for phase matching of the second harmonic wave can be determined from the following equation (4):

$$\Lambda_3 = l'\cdot(\lambda_0/2)/2\bar{n}' \quad (4)$$

wherein $\lambda_0$ : wavelength of basic laser light in vacuum
$\bar{n}'$ : effective refractive index of second harmonic wave in SHG area
$l'$ : integer equal to larger than 1

Consequently, as shown in FIG. 11, it is possible to effect optical coupling of the laser light in a part, with a pitch $\Lambda_2$, of the grating G(II), and to effect the phase matching of the harmonic wave in another part thereof, with a pitch $\Lambda_3$.

In the foregoing embodiments, in which the wavelength $\lambda_0$ of the basic laser wave is 900 nm and the effective refractive index $\bar{n}'$ of the second harmonic wave is 2.60, $\Lambda_3$ is determined as 86.54 $l'$ according to the equation (4). In order that the pitch $\Lambda_3$ becomes close to the pitch $\Lambda_2$ (=543 nm), the value of $l'$ can be selected as 6, and, in this case $\Lambda_3$ becomes equal to 519 nm.

In addition to the foregoing embodiments, the present invention is subject to various modifications, and includes all such modifications within the scope and spirit of the appended claims.

What is claimed is:

1. A second harmonic wave generating device comprising:
   a substrate;
   an active layer on said substrate for generating light of a wavelength $\lambda$ in response to injection of a current;
   a layer of a material on said substrate for generating light of a wavelength $\lambda/2$ from the light generated in said active layer; and
   a pair of electrodes for supplying said active layer with a current.

2. A device according to claim 1, further comprising means on said active layer for causing oscillation within said active layer, said oscillation means and said active layer in combination forming a laser oscillator.

3. A device according to claim 2, wherein said oscillation means includes a pair of end faces bracketing said active layer, wherein said end faces are provided with a coating for confining the light of said wavelength $\lambda$ within said active layer and taking the light of wavelength $\lambda/2$ from the device.

4. A device according to claim 2, wherein said active layer is formed in a stripe shape extended in a direction of oscillation of the confined light, and a layer of said material is positioned on each of two opposing sides of the active layer, in a second direction perpendicular to the direction of oscillation and in a position substantially the same as that of the active layer in a third direction perpendicular to both the direction of oscillation and the second direction.

5. A device according to claim 2, further comprising a clad layer formed on said active layer and provided with a ridge portion, extended, in stripe form, in a direction of oscillation of said laser oscillator.

6. A device according to claim 5, wherein a layer of said material is positioned on each of two opposing sides of the ridge portion, in a second direction perpendicular to the direction of oscillation and in a position substantially the same as that of said ridge portion in a third direction perpendicular to both the direction of oscillation and the second direction.

7. A device according to claim 5, wherein a part of said ridge portion in the direction of oscillation is replaced by a layer of said material.

8. A device according to claim 1, wherein said active layer and said layer of material are laminated on the substrate, and further comprising a first diffraction grating for diffracting the light of wavelength $\lambda$ generated in said active layer toward the layer of material as diffracted light, and a second diffraction grating for coupling the diffracted light within the layer of material.

9. A device according to claim 8, wherein the pitch $\Lambda_1$ of said first diffraction grating satisfies:

$$\Lambda_1 = l\cdot(\lambda/2\bar{n})$$

in which $\bar{n}$ is the effective refractive index for the light of wavelength $\lambda$ at said diffraction grating, and $l$ is an integer equal to or larger than 1.

10. A device according to claim 9, wherein the pitch $\Lambda_2$ of said second diffraction grating satisfies a relation:

$$\Lambda_2 = l\cdot(\lambda/2\bar{n}')$$

in which $\bar{n}'$ is the effective refractive index for the light of wavelength $\lambda$ at said diffraction grating.

11. A device according to claim 10, wherein a part of said second diffraction grating has a pitch $\Lambda_3$ satisfying a relation:

$$\Lambda_3 = l'\cdot(\lambda/2)2\bar{n}''$$

in which $\bar{n}''$ is the effective refractive index at said diffraction grating, and $l'$ is an integer equal to or larger than 1.

12. A device according to claim 8, wherein said active layer contains a III-V group compound semiconductor, and said layer of material contains a II-VI group compound semiconductor.

13. A device according to claim 8, further comprising means on said active layer for causing oscillation within said active layer, said oscillation means and said active layer in combination forming a laser oscillater.

14. A device according to claim 13, wherein said oscillation means includes a pair of end faces bracketing said active layer, wherein said end faces are provided with a coating for confining the light of said wavelength $\lambda$ within said active layer and taking the light of wavelength $\lambda/2$ from the device.

15. A device according to claim 13, wherein one of said electrodes is provided with a contact portion extended, in a stripe form, along a direction of oscillation of said laser oscillator.

16. A device according to claim 13, wherein said layer of material constitutes a ridge portion of a stripe form extended in a direction of oscillation of said laser oscillator.

17. A device according to claim 16, wherein one of said electrodes is in contact on a top of said ridge portion.

18. A device according to claim 16, wherein one of said electrodes is in contact on both sides in a lower part of said ridge portion.

19. A device according to claim 18, wherein said active layer and said layer of material are respectively sandwiched by clad layers to constitute a wave guide.

20. A device according to claim 16, wherein said active layer includes a p-n junction, said p-n junction having been formed in said active layer by one-side impurity diffusion from said ridge portion.

21. A device according to claim 1, further comprising a power source connected to said electrodes.

* * * * *

UNITED STATES PATENT AND TRADEMARK OFFICE
CERTIFICATE OF CORRECTION

PATENT NO. : 4,930,132
DATED : May 29, 1990
INVENTOR(S) : AKIRA SHIMIZU ET AL.

It is certified that error appears in the above-identified patent and that said Letters Patent is hereby corrected as shown below:

COLUMN 6

Line 42, "in" should read --is--.

COLUMN 7

Line 5, "enters" should read --enter--.
Line 6, "is" should read --are--.

COLUMN 11

Line 2, "oscillater." should read --oscillator.--.

Signed and Sealed this

Eighteenth Day of February, 1992

Attest:

HARRY F. MANBECK, JR.

Attesting Officer    Commissioner of Patents and Trademarks